United States Patent [19]
Lee et al.

[11] Patent Number: 5,552,340
[45] Date of Patent: Sep. 3, 1996

[54] NITRIDATION OF TITANIUM, FOR USE WITH TUNGSTEN FILLED CONTACT HOLES

[75] Inventors: Ching-Ying Lee, Hsin Chu; Shaw-Tzeng Hsia, Taipei; Haw Yen, Hsin-chu, all of Taiwan

[73] Assignee: Vanguard International Semiconductor Corp., Hsin-Chu, Taiwan

[21] Appl. No.: 549,262

[22] Filed: Oct. 27, 1995

[51] Int. Cl.⁶ .................................. H01L 21/28
[52] U.S. Cl. ................ 437/190; 437/192; 437/200; 437/26
[58] Field of Search .................. 437/190, 192, 437/200, 26

[56] References Cited

U.S. PATENT DOCUMENTS

| | | | |
|---|---|---|---|
| 4,994,410 | 2/1991 | Sun et al. | 437/200 |
| 5,188,979 | 2/1993 | Filipiak | 437/192 |
| 5,286,675 | 2/1994 | Chen et al. | 437/195 |
| 5,430,328 | 7/1995 | Hsue | 437/192 |
| 5,444,018 | 8/1995 | Yost et al. | 437/200 |
| 5,504,038 | 4/1996 | Chien et al. | 437/200 |

FOREIGN PATENT DOCUMENTS

| | | |
|---|---|---|
| 2-119129 | 5/1990 | Japan . |
| 6-020997 | 1/1994 | Japan . |

*Primary Examiner*—George Fourson
*Assistant Examiner*—Thomas G. Bilodeau
*Attorney, Agent, or Firm*—George O. Saile

[57] ABSTRACT

A process has been developed that allows small diameter contact holes to be filled with chemical vapor deposited tungsten, without tungsten peeling from the sides of the contact hole. The process consists of initially depositing an adhesive layer of titanium in the contact hole, followed by a rapid thermal anneal cycle, in an ammonia ambient, for purposes of creating a thin, uniform, barrier layer of titanium nitride. The titanium nitride protects the underlying titanium adhesion layer from the by-products introduced during the tungsten deposition, specifically the evolution of fluorine ions resulting from the decomposition of tungsten hexafluoride.

25 Claims, 4 Drawing Sheets

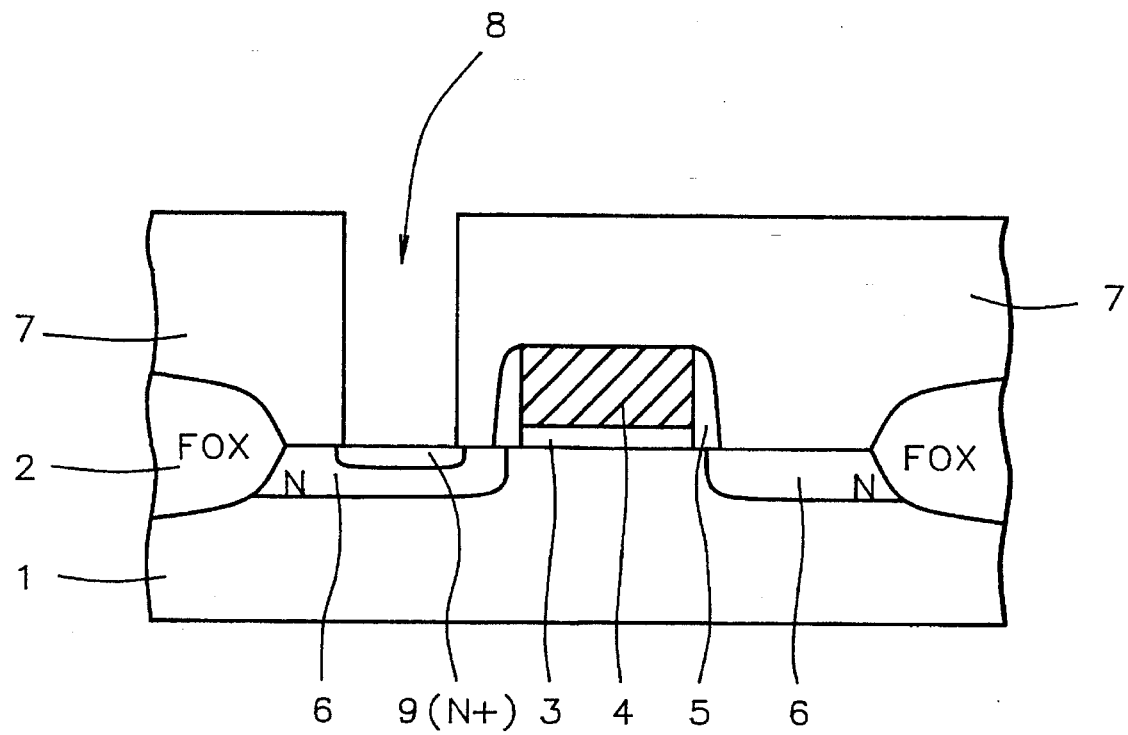
FIG. 1
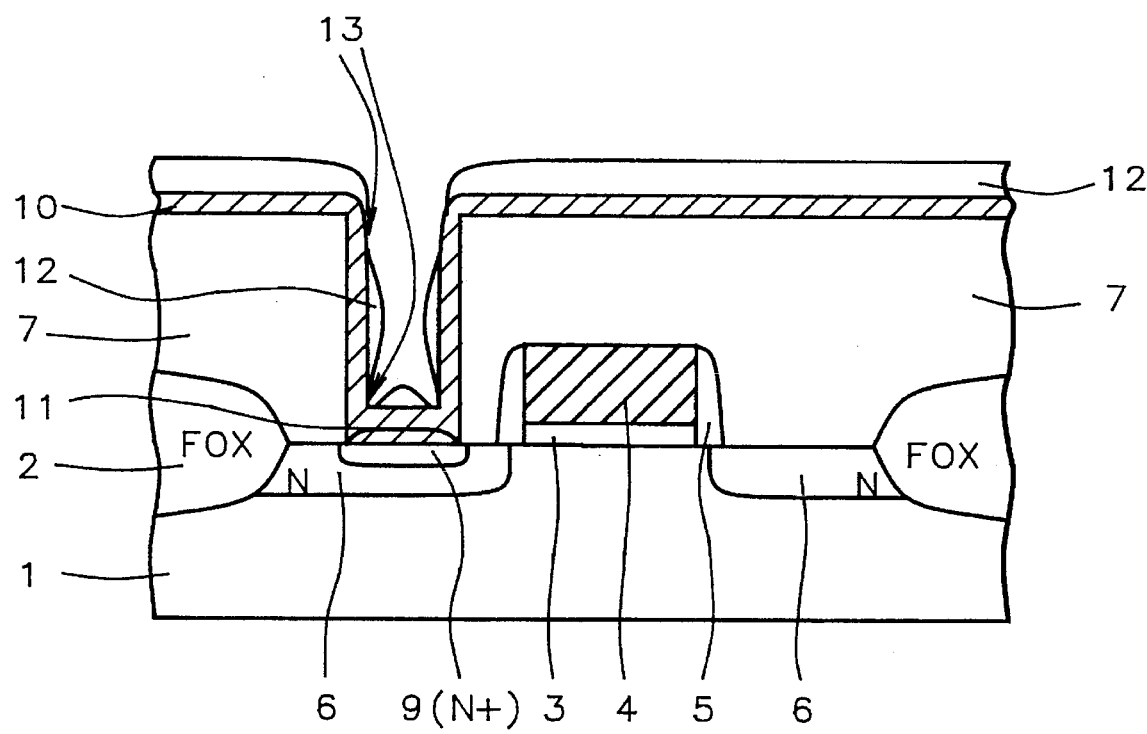
FIG. 2 – Prior Art

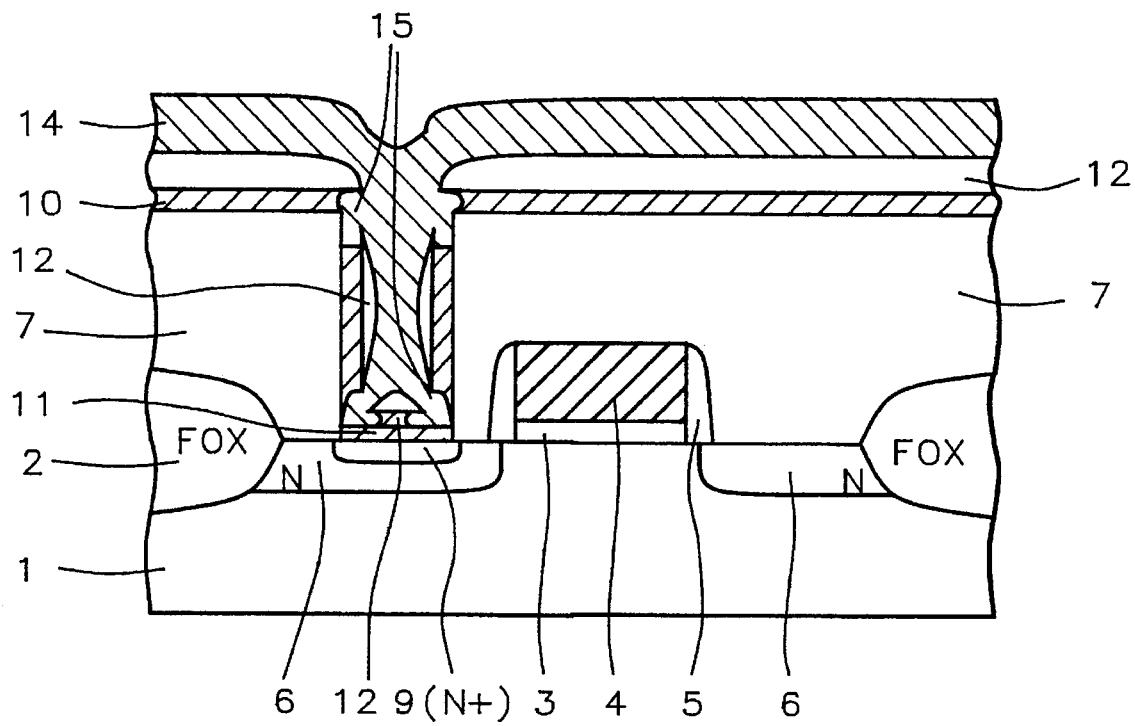
FIG. 3 – Prior Art
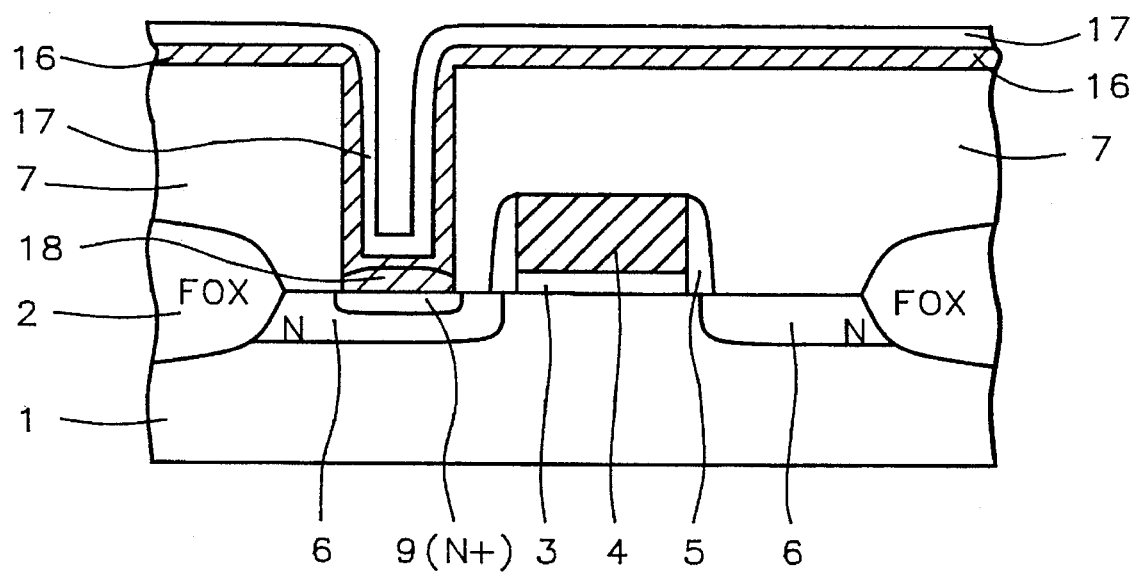
FIG. 4

NITRIDATION OF TITANIUM, FOR USE WITH TUNGSTEN FILLED CONTACT HOLES

BACKGROUND OF THE INVENTION (1) Field of the Invention

The present invention relates to a process for fabricating metal filled contact holes, used in the manufacturing of semiconductor devices.

(2) Description of Prior Art

The semiconductor industry is continually striving to reduce the cost of manufacturing silicon chips, while still attempting to increase the performance of these same devices. The ability to reduce the dimensions of critical silicon device images or shapes, have allowed these objectives to be realized. The smaller shapes, accomplished via advances in specific semiconductor fabrication disciplines such as photolithography and reactive ion etching, have allowed smaller chips to be realized. This has resulted in more chips being produced from a specific size silicon wafer, thus reducing the cost of the chip. The smaller chip size, with smaller device features, also results in performance enhancements, resulting from decreases in capacitances and resistances.

However with the benefits of performance and cost, resulting from micro-miniaturazation, come specific reliability concerns. For example, smaller contact holes, filled with an aluminum based metallization, and used to connect active silicon regions to overlying interconnect metallizations, can result in electromigration problems. The decreased cross-sectional area of the aluminum fill results in higher current densities then counterparts fabricated using wider diameter contact holes, and may not survive the expected lifetime of the device, at used conditions. To overcome this risk the semiconductor industry has directed attention to metal fills exhibiting greater electromigration resistance.

Refractory metals, such as tungsten, are now being used to fill small diameter contact holes. The ability of tungsten to withstand very high current densities, allow the use of this metal for contact holes with diameters of less then 0.5 micrometers. However the use of tungsten requires the use of additional layers, used to line the contact hole, prior to the deposition of tungsten. The adhesion of pure tungsten, to the sides of the silicon oxide contact hole, would be unsatisfactory, thus an adhesion layer of titanium is usually used prior to filling the contact hole with tungsten. In addition, when the tungsten fill is accomplished via chemical vapor deposition, using a tungsten hexafluoride source, reaction product, such as fluorine ions, can result in the attack, or etching of the titanium adhesive layer. Therefore a barrier layer, usually titanium nitride, is used on the adhesive titanium layer, to protect the titanium layer during tungsten deposition. Therefore the industry has been using a composite layer of titanium—titanium nitride, to line the small diameter contact holes prior to tungsten fill.

Chen, et al, in U.S. Pat. No. 5,286,675, have described a composite titanium—titanium nitride layer, in conjunction with tungsten fills. However that invention, as well as others, does not address the difficulty encountered when attempting to uniformly coat all surfaces of the titanium adhesive layer with titanium nitride. As the aspect ratio of the contact hole increases, as experienced with the smaller diameter contact holes used with advanced designs, the conformality or step coverage of sputtered titanium nitride significantly decreases. If adequate barrier coverage is not achieved, and exposed regions of titanium are present, the subsequent fluorine attack, during the tungsten deposition, will result in a deleterious tungsten peeling phenomena, or adhesion loss. The invention now described will present a process in which robust titanium nitride barrier layers are achieved, protecting the underlying adhesive laver of titanium from attack during the tungsten deposition.

SUMMARY OF THE INVENTION

It is an object of this invention to provide an optimized process for the fabrication of tungsten filled contact holes, used to connect active silicon device regions, in a semiconductor substrate, to an overlying interconnect metallization.

It is another object of this invention to initially deposit a titanium layer in the contact hole, prior to filling with tungsten, for purposes of performing as a contact and adhesive layer.

It is still another object of this invention to use a rapid thermal annealing procedure, in an ammonia ambient, to create a titanium nitride barrier layer on the underlying titanium layer, prior to filling the contact hole with tungsten.

It is still yet another object of this invention to deposit an additional layer of titanium nitride, on the underlying titanium nitride layer, to serve as additional barrier protection, prior to filling the contact hole with tungsten.

In accordance with the present invention a process is described for fabricating tungsten filled contact holes, with optimized barrier layers, used to connect active silicon device regions to overlying interconnect metallizations. A contact hole is opened in a dielectric material, to an active device region in a semiconductor substrate. An ion implantation is performed to increase the impurity concentration at the bottom of the contact hole. A layer of titanium is deposited, followed by rapid thermal anneal procedure, in an ammonia ambient, creating a composite layer of overlying titanium nitride on underlying titanium. The anneal procedure also results in the creation of titanium disilicide at the bottom of the contact hole. An additional layer of sputtered titanium nitride is then deposited to create a more robust barrier. Chemical vapor deposition of tungsten is then performed to fill the contact hole, followed by a dry etching process used to remove unwanted tungsten from all areas except from the filled contact hole. Interconnect metallization and patterning complete the process.

BRIEF DESCRIPTION OF THE DRAWINGS

The object and other advantages of this invention are best described in the preferred embodiment with reference to the attached drawings that include:

FIG. 1, which schematically shows a silicon device region, prior to contact hole metallization.

FIGS. 2–3, which in cross-sectional representation, schematically shows prior art, in which specific deleterious phenomena occur, as a result of contact hole filling.

FIGS. 4–7, which schematically, in cross-sectional style, describe the fabrication stages used to produce successful metal filled contact holes, using this invention.

DESCRIPTION OF THE PREFERRED EMBODIMENTS

Figure 5:
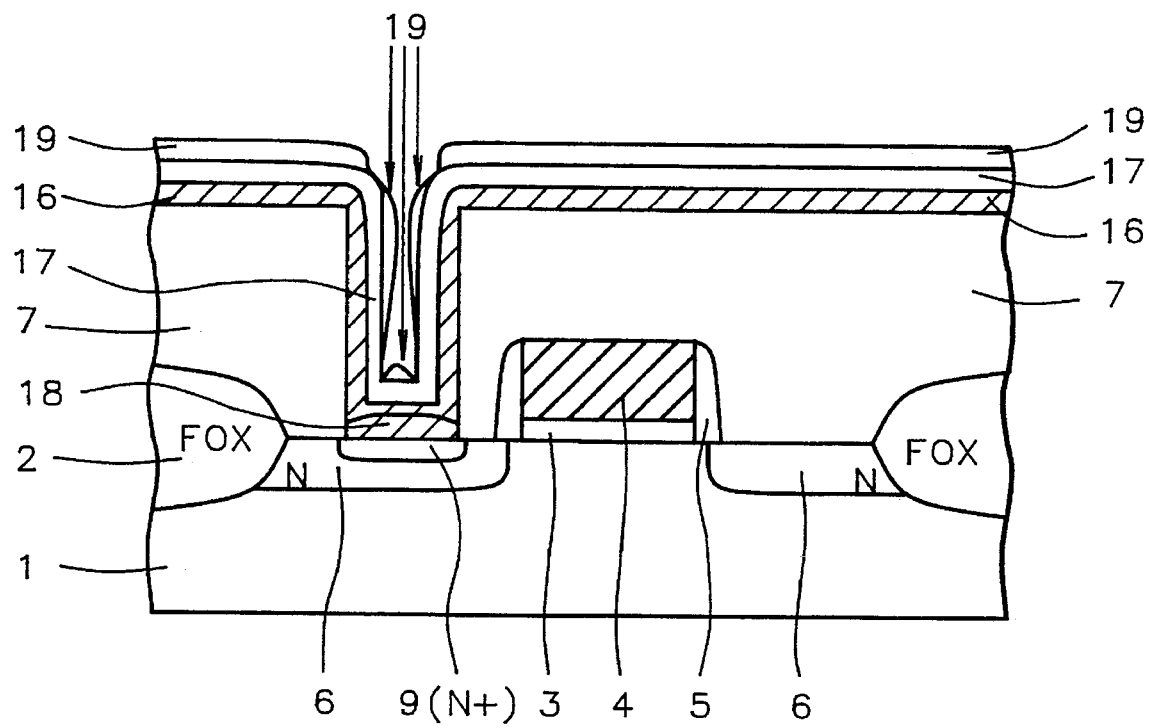

The method of forming tungsten filled contact holes, with enhanced barrier characteristics, will now be covered in detail. The barrier layer described in this invention can be used as part of metal oxide semiconductor field effect transistors, (MOSFET), that are currently being manufactured in industry, therefore only the specific areas unique to understanding this invention will be covered in detail.

A typical N type, (NFET), device, that the tungsten filled contact hole, using the enhanced barrier process can be applied to, is shown schematically in FIG. 1. The starting substrate, 1, is P type, single crystalline silicon, with a <100> orientation. Thick field oxide, 2, (FOX), regions are grown for purposes of isolation. The FOX regions are produced by patterning a silicon nitride—silicon dioxide composite, via standard photolithographic and reactive ion etching, (RIE), procedures. After removal of the photoresist pattern, the FOX region is produced via thermal oxidation to a silicon oxide thickness between about 4000 to 6000 Angstroms, in regions not protected with the composite silicon nitride—silicon dioxide masking pattern. After removal of the masking layers, using hot phosphoric acid for the silicon nitride layer, while a buffered hydrofluoric acid in used to remove the masking silicon dioxide layer, a thin silicon dioxide, gate insulator, 3, is thermally grown in a oxygen—steam ambient, at a temperature between about 800° to 950° C., to a thickness between about 50 to 300 Angstroms. A polysilicon layer is next deposited at a temperature between about 550° to 750° C., to a thickness between about 200 to 4000 Angstroms. The polysilicon layer can be deposited using insitu doping techniques, via incorporation of either phosphine or arsine, with silane. The polysilicon can also be deposited intrinsically, and doped via ion implantation of arsenic or phosphorous, at an energy between about 50 to 100 Kev., at a dose between about 1E15 to 1E16 atoms/cm$^2$. Standard photolithographic and RIE procedures, using a chlorine etch chemistry, are performed to create the polysilicon pate structure, 4, shown in FIG. 1.

Sidewall oxide spacers, 5, are next formed by initially depositing a layer of silicon oxide, to a thickness between about 2000 to 4000 Angstroms, using either low pressure chemical vapor deposition, (LPCVD), or plasma enhanced chemical vapor deposition, (PECVD), processing, using tetraethylorthosilicate as a source. Selective, anisotropic RIE processing, using CHF$_3$ as an etchant, is employed to create the sidewall oxide spacer, 5. Next an N type, source and drain region, 6, is formed via ion implantation of arsenic, at an energy between about 50 to 150 Kev., at a dose between about 1E14 to 5E15 atoms/cm$^2$.

Another layer of silicon oxide, 7, is deposited again via use of either LPCVD or PECVD techniques, to a thickness between about 6000 to 14000 Angstroms. A contact hole, 8, is opened in silicon oxide layer, 7, to expose source and drain region, 6. The contact hole, 8, is created using standard photolithographic and RIE procedures, using CHF$_3$ as an etchant.

Another ion implantation step is now performed, using arsenic at an energy between about 20 to 50 Kev., at a dose between about 1E15 to 5E15 atoms/cm$^2$, to create a heavily doped N type region, 9, at the bottom of contact hole 8, to enhance the ohmic properties of the subsequent contact. The masking photoresist is then removed using oxygen plasma ashinq processing.

FIGS. 2–3, show prior art, and attempts at filling contact holes with LPCVD tungsten. After cleaning the surface of contact hole 8, using a dilute hydrofluoric acid, a layer of titanium, 10, is deposited using r.f sputtering. The titanium layer is used to provide an adhesion link between the subsequent tungsten fill, and the silicon oxide, contact hole sides. In addition titanium, where contacting silicon as is the case at the bottom of the contact hole, and when subjected to elevated temperatures, will form a titanium disilicide layer, 11. The titanium disilicide layer will provide excellent ohmic contact properties for the subsequent device structure. This is schematically shown in FIG. 2. The barrier layer of titanium nitride, 12, is next deposited, again using r.f. sputtering. However as the aspect ratio of the contact hole increases, the ability to uniformly coat a contact hole with r.f. sputtered titanium nitride severely decreases. The aspect ratio, which is the ratio of the contact hole diameter to the contact hole depth, can become very large due to small diameter contact holes, used with aggressive, advanced designs. If the titanium nitride layer. 12, does not effectively cover underlying titanium layer, 10, as shown in FIG. 2, specific areas, 13, of unprotected titanium will exist, and may be attacked by subsequent processing reactants.

The contact hole is next filled with tungsten, 14, using LPCVD processing. The tungsten LPCVD procedure is accomplished via decomposition of tungsten hexafluoride, producing the deposited tungsten fill, 14, as well as a fluorine ion by-product. The free fluorine can attack the exposed titanium in regions, 13, and in some cases result in an enhanced removal and undercut as schematically shown as undercut region, 15, in FIG. 3. The combination of tungsten directly on the silicon oxide, contact hole sidewalls, can result in a lack of adhesion in regions, 15. This phenomena, adhesion loss of the tungsten fill, occurring as a result of reactants reaching unprotected adhesive layers, through defects in barrier layers, is more pronounced at wafer edges, where a uniform deposition of the titanium nitride barrier layer can be marginal. These series of process sequences, leading to deleterious adhesion loss, or peeling, can lead to significant yield losses, and reverse the positive aspects of microminiaturazation.

The process designed to eliminate the adhesion loss, or peeling phenomena, observed via tungsten filling of small diameter contact holes, will now be described. FIG. 4, shows a layer of r.f. sputtered titanium, 16, deposited to a thickness between about 300 to 1000 Angstroms. Prior to the deposition of titanium layer, 16, a preclean was employed to remove any native oxide from the surface of region, 9, using a solution of 200 parts water, to 1 part hydrofluoric acid, for about 90 seconds, at a temperature between about 20° to 25° C. Next a critical rapid thermal anneal step is performed to create both a titanium nitride barrier layer, 17, and a titanium disilicide layer, 18. The anneal procedure initiates with a wafer loading in the rapid thermal anneal furnace at a temperature between about 350° to 450° C., in a nitrogen flow of about 20 liters/min. This load procedure, using a high nitrogen flow, reduces the risk of native oxide formation during the wafer load cycle. Next a temperature ramp up, and stabilization step is performed at a temperature between about 575° to 625° C., for a period of between about 45 to 75 seconds, in an ammonia flow of between about 2 to 6 liters/min. A second ramp up and stabilization procedure is performed at a temperature between about 700° to 740° C., for a period between about 10 to 40 seconds, in an ammonia flow between about 2 to 6 liters/min. The temperature ramp down and wafer unload procedure is then accomplished at a temperature between about 350° to 450° C., again using a nitrogen flow of about 20 liters/min. The amount of titanium disilicide, 18, formed from the thermal reaction of titanium layer, 16, and silicon region, 9, is between about 100 to 300 Angstroms. Equally important is the creation of the barrier titanium nitride layer, 17, formed from the reaction of titanium, layer, 16, and ammonia gas, to a thickness between about 200 to 800 Angstroms. The formation of titanium nitride barrier layer, 17, also leaving unreacted titanium, 16 to provide adhesion to the silicon oxide, contact hole sides, is completely uniform due to the nitridation method. This offers superior barrier protection against tungsten deposition by-products, compared to counterpart titanium nitride barrier layers, deposited with less uniformity via sputtering procedures. The nitridation process for forming robust titanium nitride barrier layers is extendable to contact holes with diameters of less then 0.5 uM.

Figure 6:
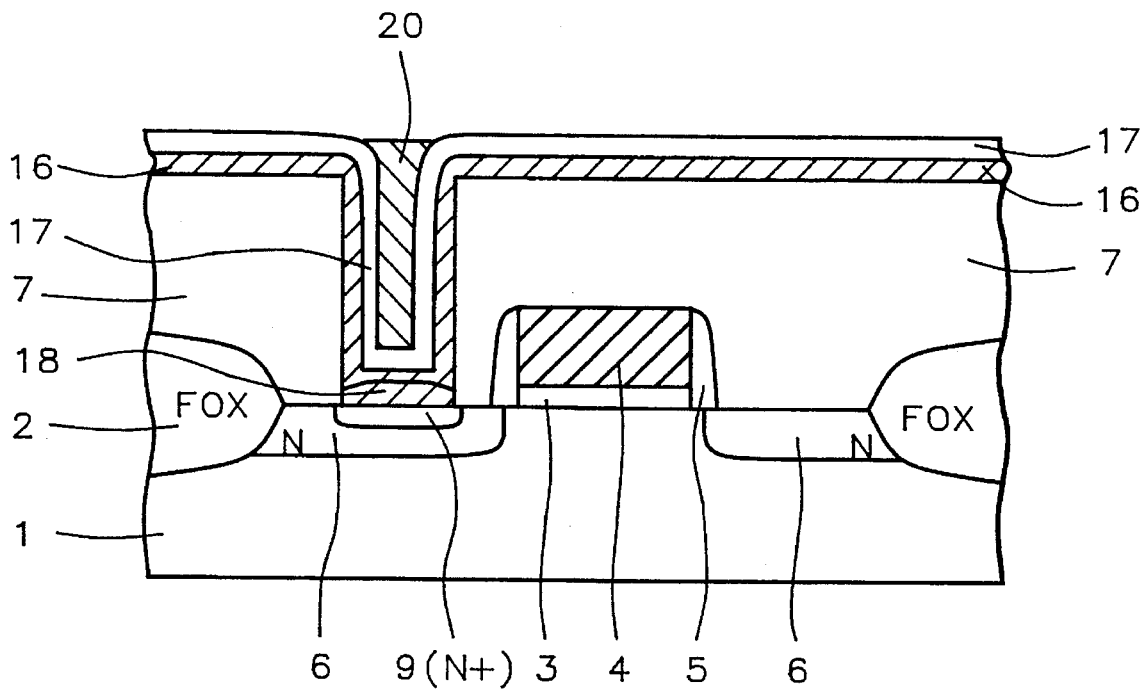

An option available in this invention is to increase the total thickness of barrier layer by using r.f. sputtering to deposit an additional titanium nitride layer, 19, to a thickness between about 200 to 600 Angstroms. This is shown schematically in FIG. 5. However the robustness of this barrier composite is highlighted by the integrity of titanium nitride layer, 17, produced by the ammonia nitridation process, resulting in excellent coverage of the underlying titanium layer, 16. The deposition of tungsten, 20, used to fill contact hole 8, is now performed at a temperature between about 400° to 500° C., to a thickness between about 5000 to 9000 Angstroms, via LPCVD processing and decomposition of tungsten hexafluoride. FIG. 6, schematically shows the robust titanium nitride barrier layer, 17, does not allow the deleterious reaction of free fluorine ions, produced during the decomposition of tungsten hexafluoride, and titanium, 16, to occur, thus eliminating the tungsten peeling, or adhesion loss phenomena observed with the prior art. Also shown in FIG. 6, is the result of a blanket RIE etchback, using a $SF_6$ chemistry. The etchback process removes the unwanted tungsten from all regions, except in the contact hole, 8.

Figure 7:
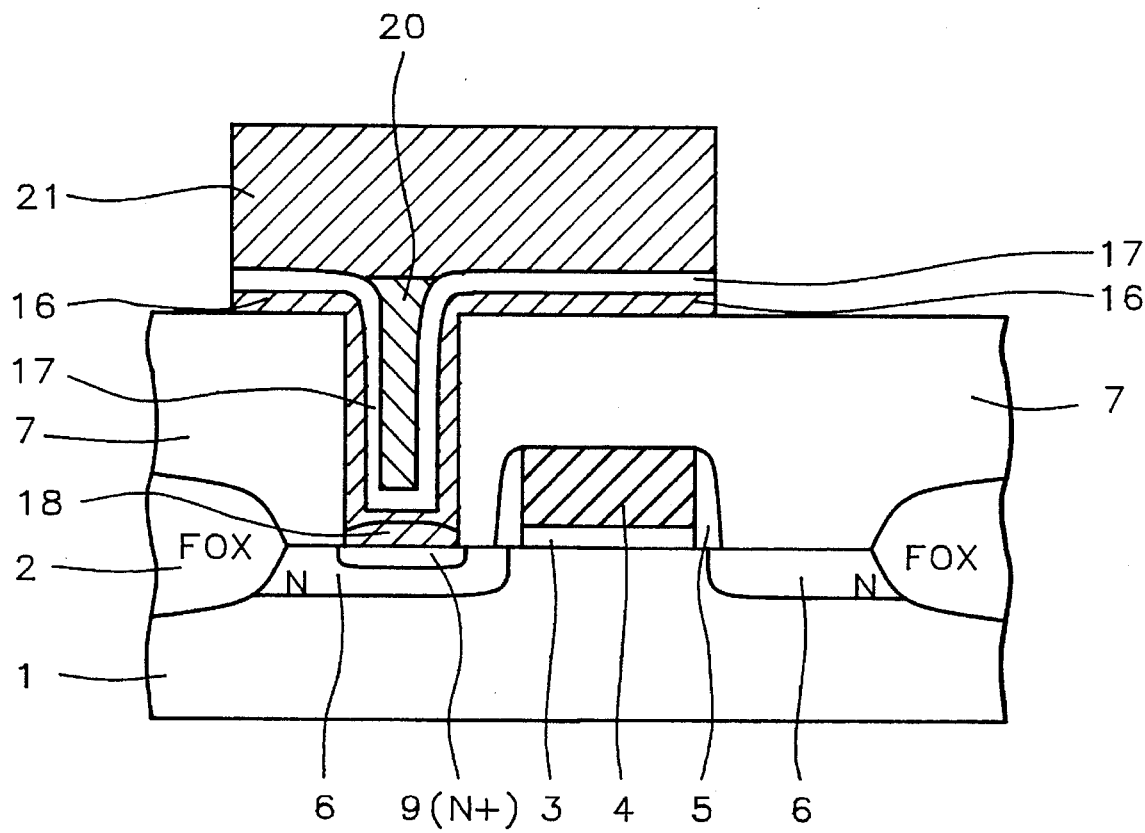

Finally FIG. 7, shows the fabrication of the interconnect metallization structure, 21. This is accomplished via r.f. sputtering of an aluminum based metallurgy, using between about 0.5 to 3% copper, and between about 0 to 1% silicon. Conventional photolithographic and RIE procedures, using a chlorine etch chemistry, are used to produce the interconnect metal structure, 21.

This process for creating enhanced titanium barrier layers, via the nitridazation of titanium, and used as a barrier layer for tungsten filled contact holes, although shown as part of an NFET device, can be applied to P type, (PFET), devices, as well as complimentary, (CMOS), as well as to bipolar type, (BiCMOS), devices.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device, on a semiconductor substrate, using a contact hole lined with adhesive and barrier layers, and filled with a metal, to provide electrical contact between an active device region in said semiconductor substrate, and an overlying interconnect metallization layer, comprising the steps of:

providing device elements on said semiconductor substrate;

depositing a dielectric layer on said semiconductor substrate, including depositing on said device elements;

photolithographic processing to open a region in photoresist, exposing said dielectric layer, directly over a specific region of said device element;

anisotropic etching of said dielectric layer, in the opened region in said photoresist, to create a contact hole to said specific region of said device element;

ion implanting a first conductivity imparting dopant into said specific region of said device element, to create said active device region;

surface cleaning of said active device region;

deposition of an adhesive layer on said dielectric layer, on sides of said contact hole, and on a surface of said active device region;

thermal annealing in an ammonia ambient to convert a surface of said adhesive layer to a first barrier layer;

deposition of a second barrier layer on said first barrier layer;

deposition of said metal, on said second barrier layer completely filling said contact hole;

etchback of said metal, to remove said metal from all areas except in said contact hole;

deposition of said interconnect metallization layer; and patterning of said interconnect metallization layer to form metal interconnect structure.

2. The method of claim 1, wherein said device element on said semiconductor substrate, is an N type field effect transistor.

3. The method of claim 1, wherein said dielectric layer is silicon oxide, deposited using LPCVD or PECVD processing, to a thickness between 6000 and 14000 Angstroms.

4. The method of claim 1, wherein said contact hole is formed via anisotropic reactive ion etching, using $CHF_3$+ $CF_4$+ argon, where a diameter of said contact hole is between about 0.3 and 0.7 uM.

5. The method of claim 1, wherein said first conductivity imparting dopant is arsenic, ion implanted at an energy between about 20 and 50 Kev., at a dose between about 1E15 and 5E15 atoms/$cm^2$.

6. The method of claim 1, wherein surface cleaning of said active device region is performed using a solution of water and hydrofluoric acid, at a temperature between about 20° and 25° C., for a time between about 75 and 105 seconds.

7. The method of claim 1, wherein said adhesive layer is titanium, deposited using r.f. sputtering, to a thickness between about 300 and 1000 Angstroms.

8. The method of claim 1, wherein thermal annealing of said adhesive layer is performed by; loading of wafers in thermal anneal furnace at a temperature between about 350° and 450° C., in a nitrogen flow of about 20 liters/min., ramp up and stabilization at a temperature between about 575° and 625° C., for between about 45 and 75 seconds in an ammonia flow between about 2 and 6 liters/min., another ramp up and stabilization step at a temperature between about 700° and 740° C., for between about 10 and 40 seconds in an ammonia flow between about 2 to 6 liters/min., and a ramp down and wafer unload in a nitrogen flow of about 20 liters/min., at a temperature between about 350° and 450° C.

9. The method of claim 1, wherein thermal annealing of said adhesive layer is performed in an ammonia ambient at a temperature between about 700 and 740° C.

10. The method of claim 1, wherein thermal annealing of said adhesive layers in an ammonia ambient, results in the formation of said first barrier layer, to a thickness between about 200 and 800 Angstroms, while leaving between about 100 and 500 Angstroms of underlying said adhesive layer, unreacted.

11. The method of claim 1, wherein thermal annealing results in the formation of a titanium disilicide layer, at the bottom of said contact hole, to a thickness between about 100 to 300 Angstroms.

12. The method of claim 1, wherein said metal is tungsten, deposited using LPCVD processing, at a temperature between about 400° and 500° C., to a thickness between about 5000 to 9000 Angstroms, using a tungsten hexafluoride source.

13. A method for fabricating a MOSFET device, on semiconductor substrate, using a contact hole lined with titanium for adhesion purposes, titanium nitride for barrier purposes, and filled with tungsten, to provide electrical contact between an active device region and an overlying interconnect metallization, comprising the steps of:

providing device elements on said semiconductor substrate;

depositing a dielectric layer on said semiconductor substrate, including deposition on said device elements;

photolithographic processing to open a region in photoresist, exposing said dielectric layer, directly over a specific region of said device element;

anisotropic etching of said dielectric layers in opened region of said photoresist, to create a contact hole to said specific region of said device element;

ion implanting a first conductivity imparting dopant, into said specific region, of said device element, to create a doped N type region;

surface cleaning of said doped N type region;

deposition of said titanium adhesion layer on said dielectric layer, on sides of said contact hole, and on said doped N type region;

thermal annealing in an ammonia ambient to convert a surface of said titanium adhesion layer, to a said first titanium nitride barrier layer, while leaving a portion of underlying said titanium adhesion layer on sides of said contact hole, and forming a titanium disilicide layer at bottom of said contact hole, between overlying said first titanium nitride barrier layer and underlying said heavily doped N type region;

depositing a second titanium nitride barrier layer, on said first titanium nitride barrier layer;

deposition of said tungsten, on said second titanium nitride barrier layer, completely filling said contact hole;

etchback of said tungsten, to remove said tungsten from all areas except in said contact hole;

deposition of said interconnect metallization layer; and patterning of said interconnect metallization layer to form a metal interconnect structure.

14. The method of claim 13, wherein said device element in said semiconductor substrates is an N type field effect transistor.

15. The method of claim 13, wherein said dielectric layer is silicon oxide, deposited using LPCVD or PECVD processing, at a temperature between about 400 and 800° C., to a thickness between about 6000 and 14000 Angstroms.

16. The method of claim 13, wherein said contact hole is formed via anisotropic reactive ion etching, using $CHF_3$+ $CF_4$+ argon, where the diameter of said contact hole is between about 0.3 and 0.7 uM 17. The method of claim 13, wherein the first conductivity imparting dopant is arsenic, ion implanted at energy between about 20 and 50 Kev., at a dose between about 1E15 and 5E15 atoms/cm$^2$.

18. The method of claim 13, wherein surface cleaning of said doped N type region is performed using a solution of water and hydrofluoric acid, at a temperature between about 20° and 25° C., for a time between about 75 and 105 seconds.

19. The method of claim 13, wherein said titanium adhesion layer is deposited via r.f. sputtering, to a thickness between about 300 and 1000 Angstroms.

20. The method of claim 13, wherein thermal annealing, of said titanium adhesive layer, is performed by; wafer loading in thermal anneal furnace at a temperature between about 350° and 450° C., in a nitrogen flow of about 20 liters/min.; ramp up and stabilization at a temperature between about 575° and 625° C., for a time between about 45 to 75 seconds, in an ammonia flow between about 2 and 6 liters/min., another ramp up and stabilization step at a temperature between about 700° and 740° C., for a time between about 10 and 40 seconds, in an ammonia flow between about 2 and 6 liters/min., and a ramp down and wafer unload in a nitrogen flow of about 20 liters/min., at a temperature between about 350° and 450° C.

21. The method of claim 13, wherein thermal annealing of said titanium adhesive layer is performed in an ammonia ambient at a temperature between about 700° and 740° C.

22. The method of claim 13, wherein thermal anneal of said titanium adhesion layer, in an ammonia ambient, results in the formation of between about 200 and 800 Angstroms of said first titanium nitride barrier layer, while leaving between about 100 and 500 Angstroms of underlying said titanium adhesion layer, unreacted.

23. The method of claim 13, wherein thermal annealing results in the formation of between about 100 and 300 Angstroms of said titanium disilicide, at the bottom of said contact hole.

24. The method of claim 13, wherein said second titanium nitride barrier layer is deposited using r.f. sputtering, to a thickness between about 200 and 600 Angstroms.

25. The method of claim 13, wherein said tungsten is deposited using LPCVD processing, at a temperature between about 400° and 500° C., to a thickness between about 5000 and 9000 Angstroms, using a tungsten hexafluoride source.

\* \* \* \* \*